United States Patent
Rose et al.

(10) Patent No.: US 6,855,939 B2
(45) Date of Patent: Feb. 15, 2005

(54) PARTICLE BEAM SYSTEM HAVING A MIRROR CORRECTOR

(75) Inventors: Harald Rose, Darmstadt (DE); Dirk Preikszas, Aschaffenburg (DE); Peter Hartel, Darmstadt (DE)

(73) Assignee: Leo Elektronenmikroskopie GmbH, Oberkochen (DE)

( * ) Notice: Subject to any disclaimer, the term of this patent is extended or adjusted under 35 U.S.C. 154(b) by 0 days.

(21) Appl. No.: 10/644,037

(22) Filed: Aug. 20, 2003

(65) Prior Publication Data

US 2004/0036031 A1 Feb. 26, 2004

Related U.S. Application Data

(63) Continuation of application No. PCT/EP02/01553, filed on Feb. 14, 2002.

(30) Foreign Application Priority Data

Feb. 20, 2001 (DE) .......................... 101 07 910

(51) Int. Cl.[7] .............. G01J 1/42; G01T 1/00; G01N 23/00; G21K 7/00; H05H 0/00
(52) U.S. Cl. ............... 250/396 R; 250/398; 250/298; 250/305; 250/311; 250/310; 313/359.1
(58) Field of Search ................ 250/398, 396 R, 250/298, 305, 311, 310; 313/359.1

(56) References Cited

U.S. PATENT DOCUMENTS

| | | | | |
|---|---|---|---|---|
| 2,161,466 A | * | 6/1939 | Henneberg ............. | 250/396 R |
| 3,660,658 A | * | 5/1972 | Leboutet et al. ........... | 250/398 |
| 4,107,526 A | * | 8/1978 | McKinney et al. ......... | 250/305 |
| 4,367,406 A | * | 1/1983 | Franzen et al. ............ | 250/305 |
| 4,866,272 A | | 9/1989 | Aoki | |
| 5,177,361 A | | 1/1993 | Krahl et al. | |
| 5,319,207 A | * | 6/1994 | Rose et al. ............. | 250/396 R |
| 5,336,885 A | | 8/1994 | Rose et al. | |
| 5,449,914 A | | 9/1995 | Rose et al. | |
| 5,644,132 A | | 7/1997 | Litman et al. | |
| 5,986,269 A | | 11/1999 | Krijn et al. | |
| 6,097,028 A | | 8/2000 | Tsuno | |
| 6,150,657 A | | 11/2000 | Kimoto et al. | |
| 6,239,430 B1 | * | 5/2001 | Weimer et al. ............. | 250/305 |
| 6,307,205 B1 | | 10/2001 | Tsuno | |
| 6,384,412 B1 | | 5/2002 | Krahl et al. | |
| 6,522,056 B1 | * | 2/2003 | Mauck ................... | 313/359.1 |
| 6,576,908 B1 | | 6/2003 | Winkler et al. | |
| 6,611,087 B2 | * | 8/2003 | Mauck ................... | 313/359.1 |

FOREIGN PATENT DOCUMENTS

DE          39 31 970          4/1991

OTHER PUBLICATIONS

"Corrected Low–Energy Electron Microscope for Multi–Mode Operation", D. Preikszas et al, Institute of Applied Physics, Darmstadt, Germany, pp. 197–198.
"Time–dependent perturbation formalism for calculating aberrations of systems with large ray gradients", H. Rose et al, Nuclear Instruments and Methods in Physics Research A 363 (1995), pp. 301 to 315.

* cited by examiner

*Primary Examiner*—John R. Lee
*Assistant Examiner*—Kalimah Fernandez
(74) *Attorney, Agent, or Firm*—Walter Ottesen

(57) ABSTRACT

The invention relates to a particle beam system comprising a particle source (1), a mirror corrector (9, 21 to 25), and an objective lens (16). The mirror corrector comprises an electrostatic mirror (9) and a magnetic beam deflector (21, 22, 23, 24, 25), which is arranged between the particle source (1) and the electrostatic mirror (9) as well as between the electrostatic mirror (9) and the objective lens (16). The magnetic beam deflector (21, 22, 23, 24, 25) is free from dispersion for each single pass. The magnetic beam deflector (21, 22, 23, 24, 25) also comprises quadrupoles and/or quadrupole components, which are provided in such a manner that a maximum of two planes, which are conjugated with regard to the diffraction plane (28) of the objective lens (16), occur on the entire path length between the first outlet from the magnetic beam deflector (21, 22, 23, 24, 25) and from the objective lens (16).

27 Claims, 3 Drawing Sheets

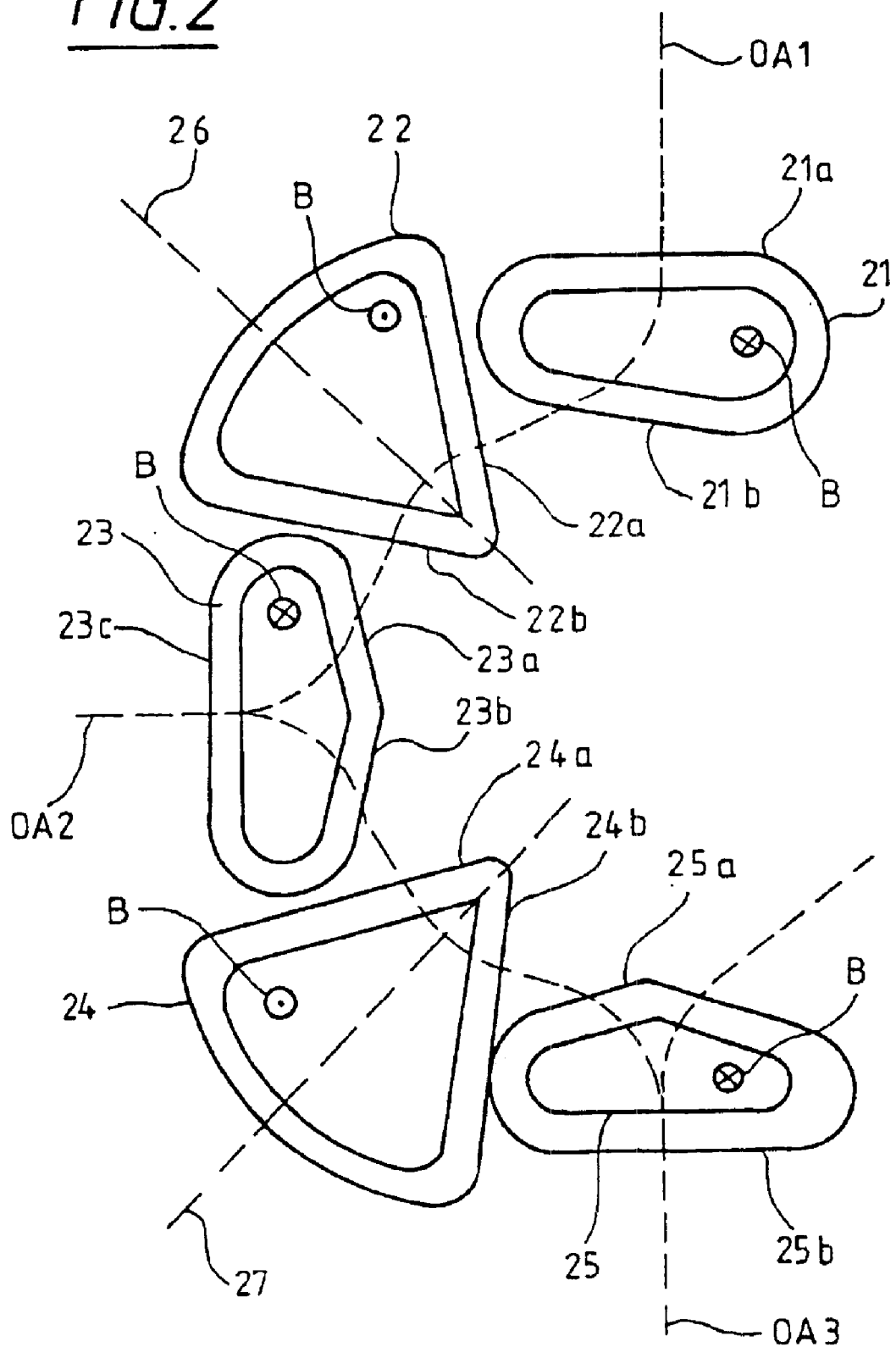

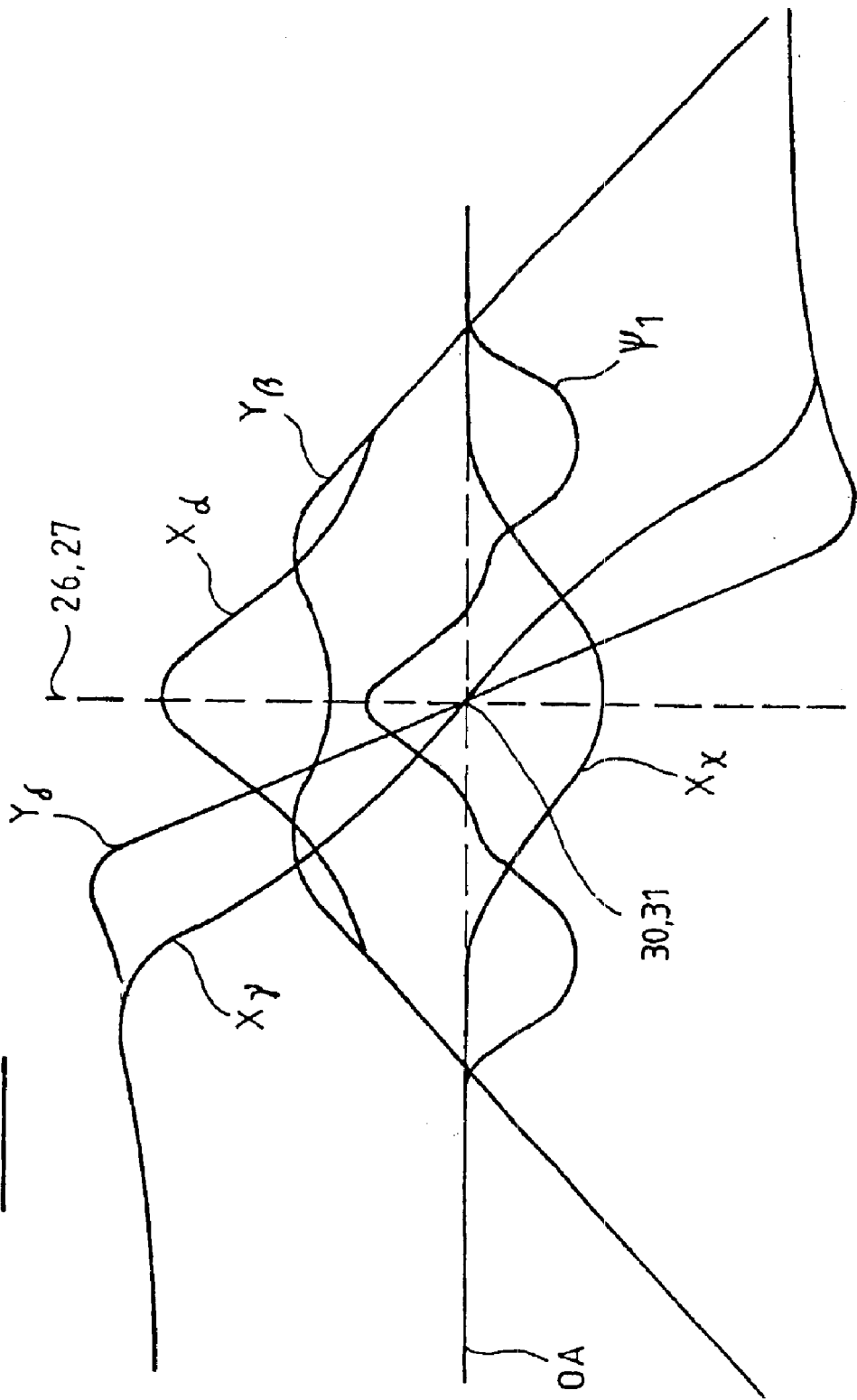

PARTICLE BEAM SYSTEM HAVING A MIRROR CORRECTOR

RELATED APPLICATION

This is a continuation patent application of international patent application PCT/EP 02/01553, filed Feb. 14, 2002, and claiming priority from German patent application 101 07 910.9, filed Feb. 20, 2001.

BACKGROUND OF THE INVENTION

The invention relates to a particle beam system having a mirror corrector. A system of this kind is, for example, disclosed in U.S. Pat. No. 5,319,207. The mirror corrector functions in such systems to correct the geometric and energy-dependent aberrations of the particle-optical components contained in the system.

Mirror correctors include a magnetic beam deflector in addition to an electrostatic mirror. Such a beam deflector functions, to a certain extent, as a switch for the particle beams in order to, on the one hand, deflect the particle beam exiting from a source to the electrostatic mirror and to deflect the particle beam, which is reflected at the electrostatic mirror, to the downstream imaging optics.

So that the beam deflector, being a non-rotational-symmetrical electron-optical component does not itself generate aberrations of the second order, it is known from U.S. Pat. No. 5,319,207 to symmetrically configure corresponding beam deflectors so that the beam deflector has two symmetry planes which are perpendicular to the beam paths of the particle beams and simultaneously lie in the bisecting line of the deflections achieved in the individual regions of the deflector. Within the beam deflector, a course of the fundamental paths of the particle beam symmetrical to the symmetry planes is achieved because of the above symmetry in the configuration of the beam deflector and the simultaneous imaging of the symmetry planes onto each other via a mirror or a combination of a mirror and a field lens. In this way, the aberrations of the second order vanish within the beam deflector. So that this symmetrical course of the beam paths within the deflector is ensured, it is, however, necessary that the electrostatic mirror, on the one hand, is mounted conjugated to the symmetry planes of the deflector and, on the other hand, simultaneously images the symmetry planes onto each other at an imaging scale of 1:1.

If in this deflector of only two quadratic sector magnets an intermediate imaging plane is imaged into the symmetry planes, is then there results a simple and short configuration but combination aberrations result because of the large dispersion in the mirror and these combination aberrations can be corrected only to a limited extent. If, in contrast, the diffraction plane of the objective lens is imaged into the symmetry plane of the deflector, then such combination aberrations do not occur because of a vanishing dispersion in the mirror. However, in this operating mode, a dispersion in the image occurs which must be compensated after a two-time passthrough through the deflector. The large focal length of the deflector then, however, requires a reduction of the beam diameter which is realizable only with very long lengths or at least two-stage objective lens systems and likewise at least two-stage mirror systems.

In U.S. Pat. No. 5,319,207, deflectors are already described which are dispersion-free for a single passthrough of the particle beam. These deflectors, however, include either three different magnetic fields having an additional superposed electrostatic field or magnetic sectors having partially concave outer surfaces. The concave outer surfaces of the magnetic sectors, however, require a corresponding concave formation of the magnetic coils whereby, in turn, also manufacturing problems occur, especially in a series production.

SUMMARY OF THE INVENTION

It is an object of the invention to provide a particle beam system having a mirror corrector which makes possible a generally simplified and more compact configuration.

The particle beam system of the invention includes: a particle source for emitting particles along a beam path; an objective lens defining a diffraction plane and being mounted on the beam path downstream of the particle source; a mirror corrector unit including an electrostatic mirror disposed on the beam path between the particle source and the objective lens; the mirror corrector further including a magnetic beam deflector disposed on the beam path so as to be disposed between the particle source and the electrostatic mirror and between the electrostatic mirror and the objective lens; and, the magnetic beam deflector being free of dispersion for each single passthrough of the particles and the magnetic beam deflector including a plurality of quadrupoles which are so determined that on the entire course of the beam path between a first-time exit from the magnetic beam deflector and the objective lens, a maximum of two planes occur conjugated to the diffraction plane of the objective lens.

As the system described in the above-mentioned U.S. Pat. No. 5,319,207, the system of the invention also includes a beam deflector which is dispersion free for each single passthrough. Under dispersion-free, it is understood that the dispersion of the deflector is so slight that a vanishing dispersion is achievable with an optimal adjustment of the components of the deflector.

In addition to the freedom from dispersion, the deflector has quadrupoles or quadrupole components which are so selected that maximally two planes, which are conjugated to the diffraction plane of the objective lens, are on the entire path course between the first-time exit from the deflector and the objective lens and, in this way, two intermediate planes of the diffraction plane of the objective lens occur.

Because the deflector is sufficiently telescopic, particle beams, which originate from the intersect point of the symmetry planes with the optical axis, are parallel outside of the deflector or are only slightly convergent.

A plane, which is conjugated to the diffraction plane of the objective lens, is preferably coincident with the plane of the electrostatic mirror, that is, that plane in which, for all paths, the reversal points lie because of the electrostatic counter-field. This condition can be adjusted via an additional field lens.

As with known beam deflectors, the beam deflector in the invention also preferably has a first symmetry plane in a first region and a second symmetry plane in a second region so that the deflection takes place symmetrically to these symmetry planes in each case.

In each of the two regions which are symmetrical to each other, the beam deflector of the invention has at least two outer magnetic sectors, respectively, and at least one inner magnetic sector. Preferably, drift distances in the magnetic-field free intermediate spaces are provided between the outer and inner magnetic sectors.

Since drift distances are provided between the magnetic sectors, the inlet and outlet edges can have a deviating inclination relative to the optical axis whereby a focusing parallel to the direction of the magnetic fields takes place. This focusing by the quadrupole components at the inlet and outlet edges corresponds to the focusing perpendicular to the magnetic field direction caused by the magnetic deflection fields so that the deflector in total generates a stigmatic imaging in the manner of a round lens. The magnetic field direction is generated by the deflecting magnetic fields. Alternatively, or in addition to the inclined inlet and outlet edges, quadrupole elements can, however, also be provided in the deflector or directly ahead or directly rearward of the deflector.

The deflecting angles in the individual magnetic sectors are so selected that after each single passthrough through the deflector, a vanishing total dispersion occurs. Combination aberrations, which occur because of the interaction of the dispersion with the color or aperture aberrations of an electrostatic mirror downstream of the deflector, can thereby be avoided. Furthermore, a dispersion does not occur in the intermediate images which dispersion would have to be extremely precisely compensated in a second passthrough through the deflector. A beam deflector, which is dispersion-free for a single passthrough, can be achieved when the magnetic field in the mid magnetic sector is antiparallel to the magnetic field direction in the external magnetic sectors.

In an advantageous embodiment, the magnetic fields are equal in magnitude in the inner and the two outer magnetic sectors. In this way, primary coils having the same number of turns can be used for the generation of the different magnetic fields in series connection whereby, in turn, reduced requirements result on the stability of the current sources.

The beam deflector is furthermore purely magnetic, that is, neither for deflection of the particle beam nor for focusing perpendicular to the deflection direction are there electrostatic fields provided.

The inclination of the inlet and outlet edges of the outer magnetic sectors to the optical axis and the beam deflection because of the magnetic fields in the magnetic sectors are advantageously so selected that particles, which enter parallel to the optical axis, are focused in or in direct proximity of the symmetry plane of the deflector. In this way, it is achieved that the field paths outside of the deflector run parallel or almost parallel to the optical axis and, as a consequence thereof, the intercept points of the field paths with the optical axis lie far away from the inlet and outlet edges of the deflector. In this way, only a single additional field lens for imaging the field paths is required but without additional imaging of the axial paths which would require a further intermediate imaging.

A corresponding field lens is preferably configured as an electrostatic immersion lens having a center electrode so that, in total, an imaging results. In this way, the beam deflector can be driven even at variable column potential with a fixed potential. Also, other forms of magnetic and/or electrostatic lenses are, however, possible.

Furthermore, it is advantageous when one or two octupole elements or elements of higher order are provided between the beam deflector and the objective lens. Elements of higher order (higher than eight-pole elements) are especially twelve pole elements at least with quadrupole windings, hexapole windings and octupole windings. The twelve pole element (s) can also have dipole windings. Alternative to these dipole windings, two or three separate individual deflection systems are, however, also possible. The twelve pole element(s) can then function as improved stigmators and ensure an overall stigmatic imaging. The twelve pole element(s) can be configured as air coils. It is also conceivable to mount the two twelve pole elements without further deflection systems between the deflector and the objective lens. In this case, however, all twelve poles of both twelve pole elements should be able to be driven separately and independently of each other; that is, all twelve poles can be charged with current. Alternatively, it is conceivable to provide individual deflecting systems between the beam deflector and the first twelve pole element, which follows the beam deflector, and between both twelve pole elements and behind the second twelve pole element seen in the beam direction. The individual beam deflection systems function then for beam adjustment.

Two electrostatic individual deflectors should be mounted between the deflector and the electrostatic mirror. Alternatively, the multipole elements in electrostatic-magnetic configuration can be mounted also between the deflector and the electrostatic mirror, especially, when the structural space provided between the objective lens and the beam deflector is insufficient.

Furthermore, it is advantageous to provide a stigmator between the particle source and the deflector in order to adjust the imaging conditions by varying the stigmator. These imaging conditions are especially the residual distortion and residual astigmatism in the deflection region of the deflector between the particle source and the electrostatic mirror.

It has been shown to be advantageous when the particles between the beam deflector and the electrostatic mirror have an energy which is not below a minimum energy. For this reason, and especially for applications with low kinetic energy of the particles, it is advantageous to provide an electrostatic immersion lens between the particle source and the deflector and to provide an immersion lens between the deflector and the objective lens. With the immersion lens, the kinetic energy of the particles in advance of the entry into the deflector is increased and is again reduced after exiting from the deflector. In this way, the deflector can be driven at constant kinetic energy of the electrons in the region of the deflector and therefore at constant magnetic deflecting fields.

The total deflection for a single passthrough through the deflector preferably amounts to 90° so that after a two-time passthrough through the deflector with an intermediate-lying reflection of the particles, the exiting optical axis runs coaxially to the entering optical axis.

The total system with the mirror corrector is preferably so operated that, simultaneously, the chromatic and aperture aberrations of the total imaging system are corrected between the particle source and the objective lens whereby the resolution of the corresponding component beam system can be increased.

BRIEF DESCRIPTION OF THE DRAWINGS

The invention will now be described with reference to the drawings wherein:

FIG. 2 shows an enlarged view of the beam deflector in FIG. 1; and,

FIG. 3 is a diagram showing the courses of the fundamental beam paths for 15 keV electrons through the beam deflector of FIG. 2.

DESCRIPTION OF THE PREFERRED EMBODIMENTS OF THE INVENTION

Figure 1:
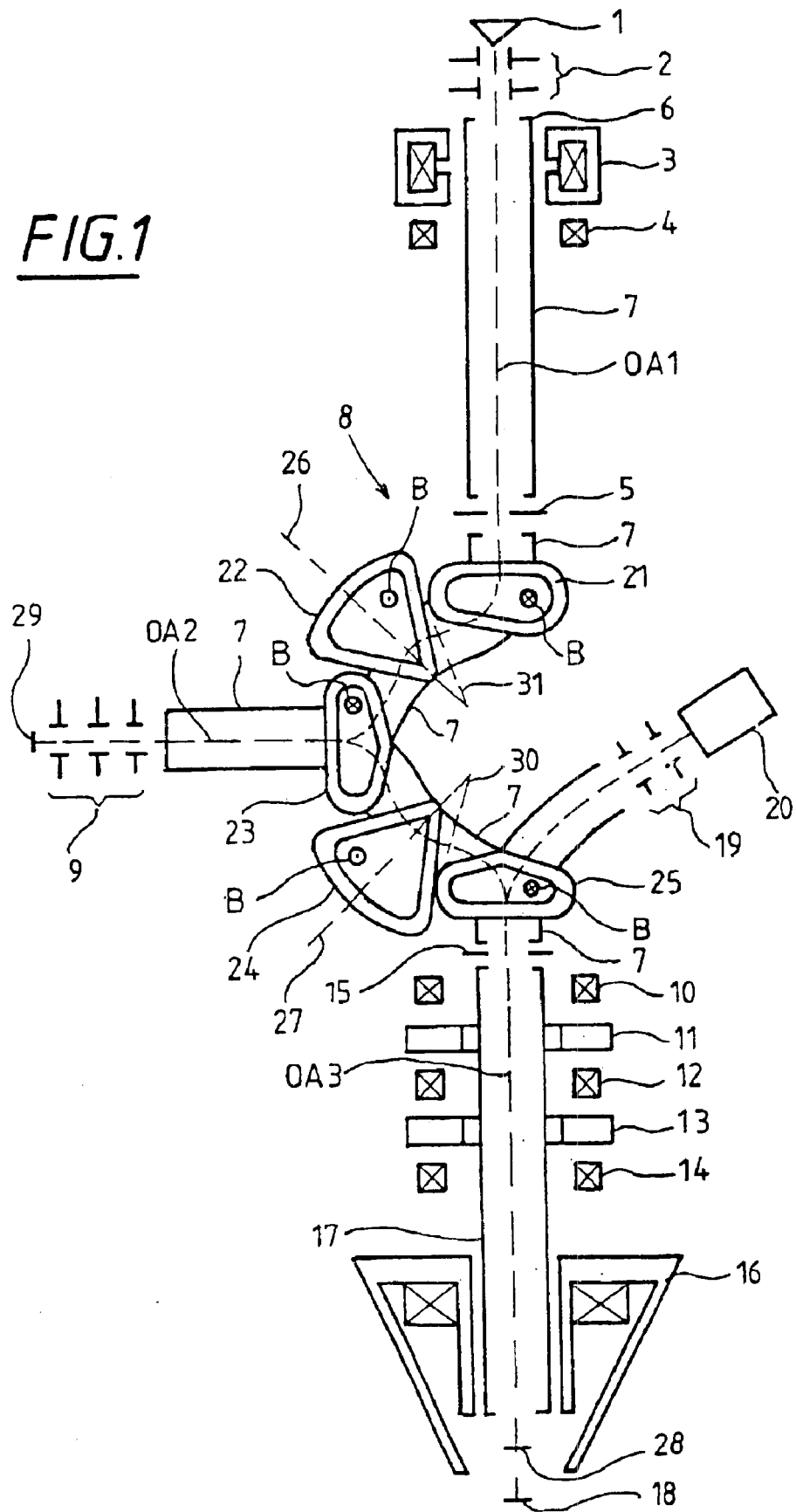
FIG. 1 shows a schematic of a raster electron microscope having a mirror corrector in accordance with the invention.

The raster electron microscope shown in FIG. 1 includes a particle source 1 having a beam accelerator 2 downstream of the particle source 1. After a run-through through the beam accelerator 2, the particles are accelerated to the potential of the beam-guiding tube 6. A magnetic condenser lens 3 and a stigmator 4 following the condenser lens 3 are provided in the region of the beam-guiding tube 6 which, for example, lies at a potential of 10 kV relative to the particle source 1. The condenser lens 3 functions to expand the beam in the beam tube following below. A first electrostatic immersion lens 5 follows the stigmator 4 via which immersion lens the electrons are further accelerated to a higher kinetic energy, namely, the kinetic energy of the inner beam-guide tube 7. In the region of the inner beam-guide tube 7, approximately at the center of the raster electron microscope, the beam deflector is mounted with the magnetic sectors 21 to 25. The beam deflector operates as a particle-optical beam splitter which deflects the electron beam, which enters along a first optical axis OA1, in the direction of an optical axis OA2 which is deflected relative to the entering optical axis OA1. At the same time, the beam deflector deflects an electron beam, which enters in the direction of the deflected optical axis OA2 in the direction of an exiting-end optical axis OA3 which runs coaxially to the entry-end optical axis OA1. The beam deflection between the entry-end optical axis OA1 and the deflected optical axis OA2 within the beam deflector takes place symmetrically to a first symmetry plane 26 and the beam deflection between the deflected optical axis OA2 and the exit-end optical axis OA3 is symmetrical to a second symmetry plane 27. The three magnetic sectors (21, 22, 23), which are run through with the deflection of the entry optical axis OA1 to the deflected optical axis OA2, therefore form a first deflection region which is symmetrical to the first symmetry plane 26. The three magnetic sectors (23, 24, 25), which are run through with the deflection from the deflected optical beam axis OA2 to the exit-end optical axis OA3, form a second deflecting region which is symmetrical to the second symmetry plane 27. The magnetic field directions in the three outer deflecting magnetic sectors (21, 23, 25) are identical for reasons of symmetry and parallel to each other. In contrast, in the two center magnetic sectors (22, 24), the magnetic field direction is anti-parallel to the magnetic field direction in the three outer magnetic sectors (21, 23, 25) so that the beam deflection is composed of component deflections in alternating directions. Further details in connection with the beam deflector are described hereinafter with respect to FIG. 2.

An electrostatic mirror 9 follows the beam deflector in the arm deflected relative to the entering optical axis OA1. The electrons, which are reflected back by the mirror 9, again enter into the magnetic sector 23 but are there deflected in the opposite direction because of the opposite direction of movement relative to the first passthrough through the magnetic sector 23. Thereafter, the back reflected electrons run through the two downstream magnetic sectors (24, 25) and thereafter exit along the optical axis OA3 coaxially to the entry optical axis OA1 out of the beam deflector. The beam deflection is generated by the beam deflector in a single passthrough and is designed for 90° so that the beam deflector overall is symmetrical to the deflected optical axis OA2. In addition to their beam deflecting characteristics, the magnetic sectors also have imaging characteristics and, for this reason, images of the mirror plane 29 occur in planes (30, 31) which lie in the proximity of the symmetry planes (26, 27) of the beam deflector. For ideal adjustment, the images of the image plane 29 lie exactly in the symmetry planes (26, 27) of the beam deflector, slight deviations from these ideal adjustments are, however, not very disadvantageous.

A second electrostatic immersion lens 15 follows the beam deflector directly in the direction of movement of the electrons. The electrons are braked by the electrostatic immersion lens 15 to the energy of the beam-guiding tube 17 in the objective lens 16. At the same time, the immersion lens 15 images the image plane 30 of the mirror plane 29 into a plane in the proximity of the diffraction plane 28 of the objective lens. Thereafter, a system of two twelve pole elements (11, 13) follows in beam direction. The two twelve pole elements (11, 13) each have an upstream simple deflection system 10, an intermediate simple deflection system 12 and a downstream simple deflection system 14.

Because of the short focal length and the close spatial proximity resulting therefrom between the primary plane and the diffraction plane of the objective lens 16, it is relatively uncritical whether the plane into which the mirror plane 29 is imaged corresponds exactly with the diffraction plane 28 of the objective lens 16. In total, only two intermediate images of the diffraction plane 28 of the objective lens 16 occur between the mirror plane and the objective lens of which one lies in the vicinity of the intermediate image 30 of the mirror plane 29 and the second lies in the vicinity of the mirror plane 29.

In the normal case, the potential of the beam-guiding tube in the objective lens 16 corresponds to the potential of the beam-guiding tube 6 in the region of the condenser lens 3. The incident electron beam is focused by the objective lens 16 in the focal plane 18 of the objective lens 16. The objective lens 16 can either be configured as a purely magnetic objective lens or as a combination of a magnetic objective lens and an electrostatic immersion lens. In the last case, the electrostatic immersion lens is configured in that the beam-guiding tube 17 ends within the objective lens 16 at the elevation of the pole shoe gap of the objective lens 16 or ends therebehind and the electrons, after exiting from the beam-guiding tube 17, are decelerated to the potential of the specimen mounted in the proximity of the focal plane 18 of the objective lens 16.

The back-scattered or secondary electrons arise because of the interaction with the specimen mounted in the proximity of the focal plane of the objective lens. These back-scattered or secondary electrons are again back accelerated into the beam-guiding tube 17 by the higher potential of the beam-guide tube and pass through the beam path between the objective lens 16 and the beam deflector in the opposite direction. Because of the inverted direction of movement, the back-scattered electrons and secondary electrons are deflected when entering into the beam deflector in the magnetic sector 25 in the opposite direction so that they are separated from the entering electron beam. With a detector 20 following the beam deflector in the deflected side arm, the secondary electrons as well as the back-scattered electrons can be detected. With an electrostatic lens 19 mounted upstream of the detector 20, an energy separation between back-scattered electrons and secondary electrons is possible in accordance with the counterfield method by applying different potentials.

The total beam deflector comprises a total of five magnetic sectors (21 to 25). All five magnetic sectors (21 to 25) include purely convex outer surfaces so that the coils can be produced relatively simply. These coils are required for the generation of the magnetic fields in the magnetic sectors. The two inner magnetic sectors (22, 24) have an identical configuration. Likewise, the three outer magnetic sectors (21, 23, 25) can be identically configured; however, it is also sufficient for the first magnetic sector 21 when this sector (as shown in FIG. 2) has only a configuration symmetrical to one half of the third magnetic sector 23. Likewise, the last outer magnetic sector 25 need only have a symmetrical configuration to one half of the magnetic sector 23 and can be optimized in the other half for the downstream detection system as may be required. The individual magnetic sectors are so configured that the inlet edge 21a of the first magnetic sector 21 is perpendicular to the entry optical axis OA1. The inlet and outlet edges 23c of the third magnetic sector 23 are perpendicular to the deflected optical axis OA2 and the inlet and outlet edges 25b of the magnetic sector 25 are perpendicular to the exiting optical axis OA3. The inclination of the input and output edges determines the focusing effect when entering and exiting the magnetic deflection fields B parallel or anti-parallel to the magnetic field direction and therefore perpendicular to the plane of the drawing of FIG. 2.

The inlet and outlet edges (21b, 22a, 22b, 23a, 23b, 24a, 24b, 25a) in the interior of the deflector are, in contrast, greatly inclined in each case to the deflected local optical axis. In this way, a focusing parallel or anti-parallel to the magnetic field direction in the magnetic sectors is achieved within the beam deflector so that this focusing by the quadrupole components is just as great as the focusing which is generated perpendicularly to the magnetic field direction by the magnetic fields so that the beam deflector generates a stigmatic image for a single passthrough. This image corresponds to the image of a round lens.

The drift path lengths between the individual magnetic sectors and the deflection angles in the individual magnetic sectors result from the situation that freedom of dispersion for a single passthrough is required for the beam deflector and a telescopically incident electron beam should leave the deflector focused as weak as possible only one value is available as a free parameter from the magnetic sectors because of the symmetry conditions.

In FIG. 3, the fundamental paths for a single passthrough through the beam deflector in FIG. 2 are shown for an electron having a kinetic energy of 15 keV. As shown, all fundamental paths within the deflector run symmetrically to the symmetry planes (26, 27). The field paths (xY, yδ) incident almost parallel to the optical axis OA are focused stigmatically in the symmetry planes (26, 27). Accordingly, a stigmatic diffraction image occurs in the symmetry plane. The focusing of the xY-path takes place via the dipole fields in the magnetic sectors; whereas, the focusing of the yδ-path takes place via the quadrupole fields which occur in the interior of the beam deflector because of the inclination of the inlet and outlet edges of the magnetic sectors. Since simultaneously the aperture paths (xα, yβ) also have a course which is symmetrical to the symmetry plane (26, 27), the total beam deflector operates as a magnetic round lens for a single passthrough. As shown by the course of the dispersion path xκ, the dispersion at the beam deflector vanishes already with a single passthrough so that the beam deflector is dispersion free for a single passthrough. In FIG. 3, the course of the magnetic field intensity along the optical axis is shown by the curve ψ1. The freedom from dispersion of the deflector for a single passthrough results from the requirement that the path integral of the product of the magnetic field intensity ψ1 and xα as well as xγ vanishes between the inlet and outlet of the deflector, that is:

$\int \psi 1 \, x\alpha \, dz = 0$ and $\int \psi 1 \, xY dz = 0$.

In the embodiment shown in FIGS. 1 to 3, only two inner magnetic sectors (22, 25) are provided. It is, however, also possible to split up these inner magnetic sectors into several magnetic sectors so that a deflector having seven or more magnetic sectors and comparable imaging power is provided. Then, for each single passthrough through the deflector 4 correspondingly more magnetic sectors will be passed through.

It is understood that the foregoing description is that of the preferred embodiments of the invention and that various changes and modifications may be made thereto without departing from the spirit and scope of the invention as defined in the appended claims.

What is claimed is:

1. A particle beam system comprising:
a particle source for emitting particles along a beam path;
an objective lens defining a diffraction plane and being mounted on said beam path downstream of said particle source;
a mirror corrector unit including an electrostatic mirror disposed on said beam path between said particle source and said objective lens;
said mirror corrector unit further including a magnetic beam deflector disposed on said beam path so as to be disposed between said particle source and said electrostatic mirror and between said electrostatic mirror and said objective lens; and,
said magnetic beam deflector being free of dispersion for each single passthrough of said particles and said magnetic beam deflector including a plurality of quadrupoles which are so determined that on the entire course of said beam path between a first-time exit from said magnetic beam deflector and said objective lens, a maximum of two planes occur conjugated to said diffraction plane of said objective lens.

2. The particle beam system of claim 1, wherein said electrostatic mirror defines a mirror plane; and, said diffraction plane of said objective lens is imaged into said mirror plane.

3. The particle beam system of claim 1, wherein said beam deflector includes at least three outer magnetic sectors and at least two inner magnetic sectors; between said particle source and said electrostatic mirror, two of said outer magnetic sectors and one of said inner magnetic sectors lying between said two outer magnetic sectors are passed through by said particles; and, between said electrostatic mirror and said objective lens, two of said outer magnetic sectors and one of said inner magnetic sectors lying between said last-mentioned two outer magnetic sectors are passed through by said particles.

4. The particle beam system of claim 3, wherein the magnetic field in said inner magnetic sectors is anti-parallel to the magnetic field direction in said outer magnetic sectors.

5. The particle beam system of claim 4, wherein said beam deflector is purely magnetic.

6. The particle beam system of claim 1, wherein said beam deflector effects a deflection symmetrical to a first symmetry plane in a first region thereof and a deflection symmetrical to a second symmetry plane in a second region thereof.

7. The particle beam system of claim 3, wherein said beam deflector has free drift distances in magnetic field free spaces between said outer and inner magnetic sectors.

8. The particle beam system of claim 3, wherein said outer magnetic sectors have inlet and outlet edges facing toward said inner magnetic sectors; and, said inlet and outlet edges are inclined to the optical axis of the particle beam.

9. The particle beam system of claim 3, wherein the deflection angles in each of said magnetic sectors are so selected that a vanishing dispersion occurs after a single passthrough through said beam deflector.

10. The particle beam system of claim 3, wherein the magnetic fields of all of said magnetic sectors are equal in magnitude.

11. The particle beam system of claim 6, wherein said particles, which enter said magnetic beam deflector approximately parallel to the optical axis, are stigmatically focused in each of said symmetry planes.

12. The particle beam system of claim 1, further comprising one of the following mounted between said magnetic beam deflector and said objective lens: one or two magnetic or electrostatic octupoles and, multipole elements of higher order.

13. The particle beam system of claim 1, further comprising a stigmator mounted between said particle source and said magnetic beam deflector.

14. The particle beam system of claim 1, further comprising a field lens between said particle source and said magnetic beam deflector.

15. The particle beam system of claim 1, further comprising a field lens between said magnetic beam deflector and said objective lens.

16. The particle beam system of claim 1, further comprising a first field lens between said particle source and said magnetic beam deflector and a second field lens between said magnetic beam deflector and said objective lens.

17. The particle beam system of claim 14, wherein said field lens is an immersion lens with which the kinetic energy of the particles is increased before entering into said magnetic beam deflector.

18. The particle beam system of claim 15, wherein said field lens is an immersion lens with which the kinetic energy of the particles is reduced after exiting from said magnetic beam deflector.

19. The particle beam system of claim 3, wherein said objective lens defines an exit end optical axis; one of said magnetic sectors is closer to said objective lens than the remaining ones of said magnetic sectors and said one magnetic sector has a side facing away from said objective lens; and, wherein said system further includes a particle detector disposed on said side of said one magnetic sector and on opposite lying sides of said exit end optical axis relative to said electrostatic mirror; and, said one magnetic sector effects a separation of collected particles exiting from a specimen from the primary particles.

20. A particle beam system having an optical axis and comprising:
a particle source for emitting particles along a beam path;
an objective lens defining a diffraction plane and being mounted on said beam path downstream of said particle source;
a mirror corrector unit including an electrostatic mirror disposed on said beam path between said particle source and said objective lens;
said mirror corrector unit further including a magnetic beam deflector disposed on said beam path so as to be disposed between said particle source and said electrostatic mirror and between said electrostatic mirror and said objective lens;
said magnetic beam deflector being free of dispersion for each single passthrough of said particles and said magnetic beam deflector including a plurality of quadrupoles which are so determined that on the entire course of said beam path between a first-time exit from said magnetic beam deflector and said objective lens, a maximum of two planes occur conjugated to said diffraction plane of said objective lens;
said magnetic beam deflector having an entry end and a second-time exit therefrom and said magnetic beam deflector defining a first symmetry plane between said entry end and said first-time exit and a second symmetry plane between said first-time exit and said second-time exit; and,
said first and second symmetry planes intersecting with said optical axis and said magnetic beam deflector being sufficiently telescopic so as to permit component beams which originate at the intersections of said symmetry planes with said optical axis to run parallel or slightly convergent outside of said magnetic beam deflector.

21. The particle beam system of claim 20, wherein said beam deflector includes at least three outer magnetic sectors and at least two inner magnetic sectors; between said particle source and said electrostatic mirror, two of said outer magnetic sectors and one of said inner magnetic sectors lying between said two outer magnetic sectors are passed through by said particles; and, between said electrostatic mirror and said objective lens, two of said outer magnetic sectors and one of said inner magnetic sectors lying between said last-mentioned two outer magnetic sectors are passed through by said particles.

22. The particle beam system of claim 20, wherein said particles, which enter said magnetic beam deflector approximately parallel to the optical axis, are stigmatically focused in each of said symmetry planes.

23. The particle beam system of claim 21, wherein said objective lens defines an exit end optical axis; one of said magnetic sectors is closer to said objective lens than the remaining ones of said magnetic sectors and said one magnetic sector has a side facing away from said objective lens; and, wherein said system further includes a particle detector disposed on said side of said one magnetic sector and on opposite lying sides of said exit end optical axis relative to said electrostatic mirror; and, said one magnetic sector effects a separation of collected particles exiting from a specimen from the primary particles.

24. A particle beam system comprising:
a particle source for emitting particles along a beam path;
an objective lens defining a diffraction plane and being mounted on said beam path downstream of said particle source;
a mirror corrector unit including an electrostatic mirror disposed on said beam path between said particle source and said objective lens;
said mirror corrector unit further including a magnetic beam deflector disposed on said beam path so as to be disposed between said particle source and said electrostatic mirror and between said electrostatic mirror and said objective lens;
said magnetic beam deflector being free of dispersion for each single passthrough of said particles and said magnetic beam deflector including a plurality of quadrupoles which are so determined that on the entire course of said beam path between a first-time exit from said magnetic beam deflector and said objective lens, a maximum of two planes occur conjugated to said diffraction plane of said objective lens;
a first field lens between said particle source and said magnetic beam deflector and a second field lens between said magnetic beam deflector and said objective lens;
said field lenses each being an immersion lens with which the kinetic energy of the particles is increased before entering into said magnetic beam deflector; and each of said field lenses being an immersion lens with which the kinetic energy of the particles is reduced after exiting from said magnetic beam deflector.

25. The particle beam system of claim 24, wherein said beam deflector includes at least three outer magnetic sectors and at least two inner magnetic sectors; between said particle source and said electrostatic mirror, two of said outer magnetic sectors and one of said inner magnetic sectors lying between said two outer magnetic sectors are passed through by said particles; and, between said electrostatic mirror and said objective lens, two of said outer magnetic sectors and one of said inner magnetic sectors lying between said last-mentioned two outer magnetic sectors are passed through by said particles.

26. The particle beam system of claim 24, wherein said beam deflector effects a deflection symmetrical to a first symmetry plane in a first region thereof and a deflection symmetrical to a second symmetry plane in a second region thereof; and, said particles, which enter said magnetic beam deflector approximately parallel to the optical axis, are stigmatically focused in each of said symmetry planes.

27. The particle beam system of claim 25, wherein said objective Lens defines an exit end optical axis; one of said magnetic sectors is closer to said objective lens than the remaining ones of said magnetic sectors and said one magnetic sector has a side facing away from said objective lens; and, wherein said system further includes a particle detector disposed on said side of said one magnetic sector and on opposite lying sides of said exit end optical axis relative to said electrostatic mirror; and, said one magnetic sector effects a separation of collected particles exiting from a specimen from the primary particles.

* * * * *